(12) United States Patent  
Kim et al.

(10) Patent No.: US 8,067,272 B2
(45) Date of Patent: *Nov. 29, 2011

(54) INTEGRATED CIRCUIT PACKAGE SYSTEM FOR PACKAGE STACKING AND MANUFACTURING METHOD THEREOF

(75) Inventors: Young Cheol Kim, Yongin-si (KR); Koo Hong Lee, Seoul (KR); Jae Hak Yee, Shanghai (CN); Ii Kwon Shim, Singapore (SG)

(73) Assignee: Stats Chippac Ltd., Singapore (SG)

( * ) Notice: Subject to any disclaimer, the term of this patent is extended or adjusted under 35 U.S.C. 154(b) by 6 days.

This patent is subject to a terminal disclaimer.

(21) Appl. No.: 12/578,797

(22) Filed: Oct. 14, 2009

(65) Prior Publication Data

US 2010/0038768 A1    Feb. 18, 2010

Related U.S. Application Data

(63) Continuation of application No. 11/462,588, filed on Aug. 4, 2006, now Pat. No. 7,622,333.

(51) Int. Cl.
  *H01L 21/44* (2006.01)
  *H01L 21/48* (2006.01)
  *H01L 21/50* (2006.01)
  *H01L 23/495* (2006.01)

(52) U.S. Cl. ........ 438/123; 438/124; 438/666; 257/676; 257/787; 257/E23.043; 257/E23.085

(58) Field of Classification Search .......... 257/686, 257/777, 723, 666, 676, 787, E23.004, E23.043, 257/E23.047, E23.048, E25.006, E25.018, 257/E25.021, E25.027, E23.085, E21.614; 438/112, 123, 124, 127, 107, 109, 110

See application file for complete search history.

(56) References Cited

U.S. PATENT DOCUMENTS

| | | | |
|---|---|---|---|
| 5,594,275 A | 1/1997 | Kwon et al. | |
| 5,757,080 A * | 5/1998 | Sota | 257/777 |
| 5,870,289 A | 2/1999 | Tokuda et al. | |
| 6,020,629 A | 2/2000 | Farnworth et al. | |
| 6,239,367 B1 | 5/2001 | Hsuan et al. | |
| 6,337,510 B1 | 1/2002 | Chun-Jen et al. | |
| 6,476,474 B1 * | 11/2002 | Hung | 257/686 |
| 6,534,859 B1 | 3/2003 | Shim et al. | |
| 6,590,281 B2 | 7/2003 | Wu et al. | |
| 6,677,674 B2 | 1/2004 | Nagao | |
| 6,724,074 B2 | 4/2004 | Song et al. | |
| 6,759,737 B2 | 7/2004 | Seo et al. | |
| 6,764,880 B2 | 7/2004 | Wu et al. | |
| 6,784,547 B2 | 8/2004 | Pepe et al. | |
| 6,849,949 B1 | 2/2005 | Lyu et al. | |

(Continued)

FOREIGN PATENT DOCUMENTS

JP   4340751   11/1992

*Primary Examiner* — A. Sefer
*Assistant Examiner* — Dilinh Nguyen
(74) *Attorney, Agent, or Firm* — Mikio Ishimaru

(57) ABSTRACT

A stackable multi-chip package system is provided including forming an external interconnect having a base and a tip, connecting a first integrated circuit die and the base, stacking a second integrated circuit die over the first integrated circuit die in an active side to active side configuration, connecting the second integrated circuit die and the base, and molding the first integrated circuit die, the second integrated circuit die, and the external interconnect partially exposed.

15 Claims, 9 Drawing Sheets

U.S. PATENT DOCUMENTS

| | | |
|---|---|---|
| 6,984,881 B2 | 1/2006 | Takiar |
| 6,998,703 B2 | 2/2006 | Di Stefano |
| 7,045,396 B2 | 5/2006 | Crowley et al. |
| 7,078,794 B2 | 7/2006 | Lee |
| 7,138,704 B2 | 11/2006 | Lien et al. |
| 7,145,247 B2 | 12/2006 | Kawano et al. |
| 7,193,309 B2 | 3/2007 | Huang et al. |
| 7,622,333 B2 * | 11/2009 | Kim et al. .................... 438/123 |
| 7,645,638 B2 | 1/2010 | Kim et al. |
| 7,683,467 B2 | 3/2010 | Jang et al. |
| 2001/0015485 A1 | 8/2001 | Song et al. |
| 2003/0209740 A1 | 11/2003 | Miyamoto et al. |
| 2004/0021230 A1 | 2/2004 | Tsai et al. |
| 2004/0124539 A1 | 7/2004 | Yang et al. |
| 2005/0189623 A1 | 9/2005 | Akram et al. |
| 2006/0151865 A1 | 7/2006 | Han et al. |
| 2006/0249851 A1 | 11/2006 | Karnezos |
| 2007/0117266 A1 | 5/2007 | Ball |
| 2008/0029905 A1 | 2/2008 | Merilo et al. |
| 2008/0079130 A1 | 4/2008 | Ha et al. |
| 2008/0136005 A1 | 6/2008 | Lee et al. |
| 2008/0136006 A1 | 6/2008 | Jang et al. |
| 2008/0136007 A1 | 6/2008 | Kim et al. |

* cited by examiner

INTEGRATED CIRCUIT PACKAGE SYSTEM FOR PACKAGE STACKING AND MANUFACTURING METHOD THEREOF

CROSS-REFERENCE TO RELATED APPLICATION(S)

This is a continuation of U.S. patent application Ser. No. 11/462,588 filed Aug. 4, 2006, now U.S. Pat. No. 7,622,333.

The present application contains subject matter related to U.S. patent application Ser. No. 11/462,568, now U.S. Pat. No. 7,645,638. The related application is assigned to STATS ChipPAC Ltd. The subject matter thereof is incorporated herein by reference thereto.

TECHNICAL FIELD

The present invention relates generally to integrated circuit packages and more particularly to stackable integrated circuit packages.

BACKGROUND ART

Across all sectors, industries, and geographies, demands continue for the electronic industry to provide products that are lighter, faster, smaller, multi-functional, more reliable, and more cost-effective. In order to meet these expanding requirements of so many and varied consumers, more electrical circuits need to be more highly integrated to provide the functions demanded. Across virtually all applications, there continues to be growing demand for reducing size, increasing performance, and improving features of integrated circuits.

The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to include more features as well as reduce the size of the integrated circuits. However, increasing the density of integration in integrated circuits may be expensive and have technical limitations. Though technology continues its growth to once unimagined extents, practical limits of individual integrated circuits do exist.

To meet these needs, three-dimensional type integrated circuit packaging techniques have been developed and used. Packaging technologies are increasingly using smaller form factors with more circuits in three-dimensional packages. In general, package stacks made by stacking packages and stacked chip packages made by stacking chips in a package have been used. Package stacks may be manufactured by stacking packages that have already passed the necessary tests for their functions. Therefore, the yields and reliability of these package stacks may be higher than those stacked chip packages manufactured by stacking chips without being tested. However, the package stacks may be thicker as compared with stacked chip packages, because of the thickness of each individual stacked package.

Stacked packages are also susceptible to warpage causing uneven or missing mounting features or electrical connections. Attempts to provide stacking features have met with difficult to control manufacturing, incompatible or incongruous materials, as well as insufficient structural integrity. The stacking features must provide both structural and electrical integrity and uniformity in order to provide reliable, high yield and functioning systems. In addition to providing the necessary structural and electrical integrity, the packages must provide an easy mounting process. The easy mounting process requires high yield for finished devices as well as known and economical manufacturing and equipment.

Every new generation of integrated circuits with increased operating frequency, performance and the higher level of large scale integration have underscored the need for back-end semiconductor manufacturing to increase the heat management capability within an encapsulated package. It is well acknowledged that when a semiconductor device becomes denser in term of electrical power consumption per unit volume, heat generated is also increases correspondingly. More and more packages are now designed with an external heat sink or heat slug to enhance the ability of heat being dissipated to the package ambient environment. As the state of the art progresses, the ability to adequately dissipate heat is often a constraint on the rising complexity of package architecture design, smaller footprint, higher device operating speed and power consumption.

As more functions are packed into the integrated circuits and more integrated circuits into the package, more heat is generated degrading the performance, the reliability, and the lifetime of the integrated circuits. Unlike heat, EMI should not be dissipated to the environment but its energy should be absorbed by the system back to a ground plane.

Thus, a need still remains for a stackable multi-chip package system providing low cost manufacturing, improved reliability, increased thermal performance, and robust structural support for thin profile integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stackable multi-chip package system including forming an external interconnect having a base and a tip, connecting a first integrated circuit die and the base, stacking a second integrated circuit die over the first integrated circuit die in an active side to active side configuration, connecting the second integrated circuit die and the base, and molding the first integrated circuit die, the second integrated circuit die, and the external interconnect partially exposed.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
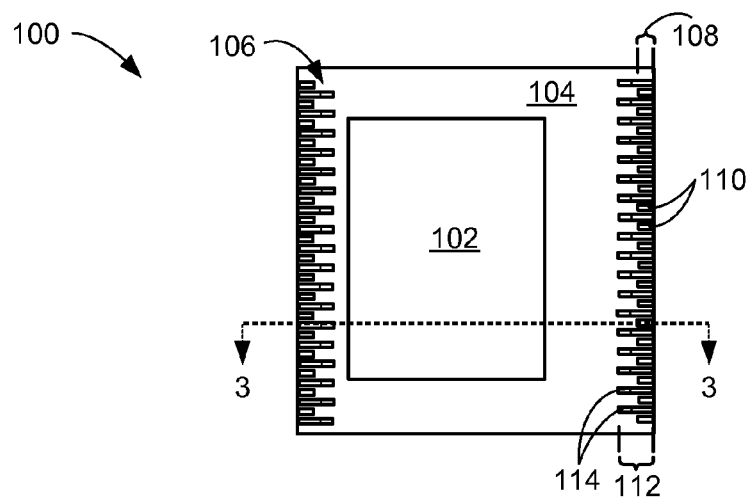
FIG. 1 is a top view of a stackable multi-chip package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a top view of a stackable multi-chip package system 100 in an embodiment of the present invention. The top view depicts a first non-active side 102 of an integrated circuit die surrounded an encapsulation 104, such as an epoxy mold compound. The first non-active side 102 may serve as a thermal dissipation path for the stackable multi-chip package system 100. The first non-active side 102 is shown offset from the center towards to the left edge, in this view, of the stackable multi-chip package system 100.

The stackable multi-chip package system 100 has dual land rows 106. The dual land rows 106 have a first row 108 of first lands 110, such as copper alloy, nickel/palladium, or gold alloy land sites, and a second row 112 of second lands 114, such as copper alloy, nickel/palladium, or gold alloy land sites. The first lands 110 and the second lands 114 may be made from any number of materials to provide a bondable surface. The second lands 114 extend more to the interior of the stackable multi-chip package system 100 than the first lands 110. The first row 108 and the second row 112 are staggered allowing connection to the first lands 110 without impeding connections to the second lands 114.

For illustrative purposes, the stackable multi-chip package system 100 is shown having the dual land rows 106, although it is understood that the number of rows may differ. Also for illustrative purposes, both top and bottom surfaces of the stackable multi-chip package system 100 are shown having first lands 110 and the second lands 114, although it is understood that the stackable multi-chip package system 100 may not have both land types or may not be on both the top and bottom surfaces. Further for illustrative purposes, the non-active side 102 is exposed to ambient, although it is understood that the non-active side 102 may not be exposed.

Figure 2:
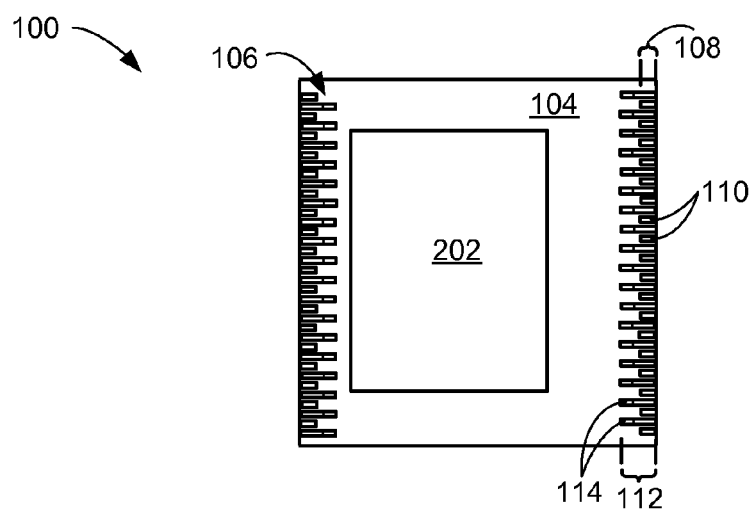
FIG. 2 is a bottom view of the stackable multi-chip package system of FIG. 1.

Referring now to FIG. 2, therein is shown a bottom view of the stackable multi-chip package system 100 of FIG. 1. The bottom view depicts a second non-active side 202 of an integrated circuit die surrounded the encapsulation 104, such as an epoxy mold compound. The second non-active side 202 may serve as a thermal dissipation path for the stackable multi-chip package system 100. The second non-active side 202 is shown offset from the center towards to the right edge, in this view, of the stackable multi-chip package system 100.

The stackable multi-chip package system 100 has the dual land rows 106. The dual land rows 106 have the first row 108 of the first lands 110, such as copper alloy or nickel/palladium land sites, and the second row 112 of the second lands 114, such as copper alloy or nickel/palladium land sites. The second lands 114 extend more to the interior of the stackable multi-chip package system 100 than the first lands 110. The first row 108 and the second row 112 are staggered allowing connection to the first lands 110 without impeding connections to the second lands 114.

For illustrative purposes, the stackable multi-chip package system 100 is shown having the dual land rows 106, although it is understood that the number of rows may differ. Also for illustrative purposes, the second non-active side 202 is exposed to ambient, although it is understood that the second non-active side 202 may not be exposed.

Figure 3:
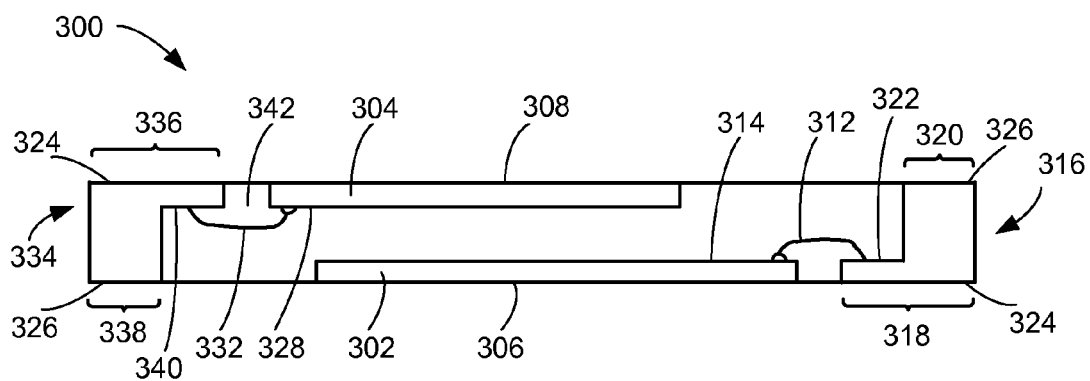
FIG. 3 is a cross-sectional view of a stackable multi-chip package system in an embodiment of the present invention.

Referring now to FIG. 3, therein is shown a cross-sectional view of a stackable multi-chip package system 300 in an embodiment of the present invention. This cross-sectional view may also represent the cross-sectional view of the stackable multi-chip package system 100 along the segment line 3-3 of FIG. 1. The stackable multi-chip package system 300 includes a stack of integrated circuit dice with a first integrated circuit die 302, such as a thin or ultra thin integrated circuit die, below a second integrated circuit die 304, such as a thin or ultra thin integrated circuit die. The second integrated circuit die 304 and the first integrated circuit die 302 may be substantially the same or the same type, such as functionality or technology, or may be different.

A first non-active side 306 of the first integrated circuit die 302 and a second non-active side 308 of the second integrated circuit die 304 are exposed to ambient and may be used as thermal dissipation surfaces. First internal interconnects 312, such as bond wires or ribbon bond wires, connect a first active side 314 of the first integrated circuit die 302 and first external interconnects 316, such as leads.

The first external interconnects 316 have L-shape configurations with first bases 318 of the L-shape configurations extending more to the interior of the stackable multi-chip package system 300 than first tips 320 of the L-shape configuration. The first internal interconnects 312 attach to first inner portions 322 of the first bases 318. Sides of the first bases 318 opposite the first inner portions 322 are part of second lands 324 of the second row 112 of FIG. 2. The first tips 320 are part of first lands 326 of the first row 108 of FIG. 1.

A second active side 328 of the second integrated circuit die 304 is over and faces the first active side 314. The second integrated circuit die 304 is offset from the first integrated circuit die 302 such that the second integrated circuit die 304 does not perturb the connections of the first internal interconnects 312 and the first integrated circuit die 302. Second internal interconnects 332, such as bond wires or ribbon bond wires, connect the second active side 328 and second external interconnects 334. For illustrative purposes, the first integrated circuit die 302 and the second integrated circuit die 304 are shown in an offset configuration, although it is understood that the first integrated circuit die 302 and the second integrated circuit die 304 may not be offset to reduce the overall size of the stackable multi-chip package system 300.

The second external interconnects 334 are shown in similar L-shape configurations as the first external interconnects 316 but rotated 180 degrees or referred to as inverted from the first external interconnects 316. Second bases 336 of the second external interconnects 334 overhang second tips 338 of the second external interconnects 334. The second external interconnects 324 may be positioned such that the second bases 336 are coplanar with the first tips 320 of the first external interconnects 316. The second internal interconnects 332 attach the second inner portions 340 of the second bases 336 to the second active side 328 of the second integrated circuit die 304. Sides of the second bases 336 opposite the second inner portions 340 are part of the second lands 324 of the second row 112 of FIG. 1. The second tips 338 are part of the first lands 326 of the first row 108 of FIG. 2.

An encapsulation 342, such as an epoxy mold compound, covers the second internal interconnects 332 and the first internal interconnects 312. The encapsulation 342 partially covers the first integrated circuit die 302, with the first non-active side 306 exposed, and the second integrated circuit die 304, with the second non-active side 308 exposed. The first active side 314 and the second active side 328 have part of the encapsulation 342 serving as a spacer as well as a structure for planar rigidity.

The encapsulation 342 also partially covers the first external interconnects 316 exposing the first lands 326 and the second lands 324 of the first external interconnects 316. Similarly, the encapsulation 342 partially covers the second external interconnects 334 exposing the first lands 326, the second lands 324 of the second external interconnects 334. The encapsulation 342 forms a coplanar surface with the first bases 318 and the first tips 320.

The staggered configuration of the first row 108 of FIG. 1 and the second row 112 of FIG. 1 are the first external interconnects 316 and the second external interconnects 334 at alternating locations forming mold interlock features. The interlock features improves performance in moisture level sensitivity (MSL) tests as well as increase structural rigidity.

The stackable multi-chip package system 300 may tested to verify known good devices (KGD) of the second integrated circuit die 304 and the first integrated circuit die 302. The stackable multi-chip package system 300 may be a thin package, especially with thin or ultra-thin dice, having a package height of 0.20 mm.

Figure 4:
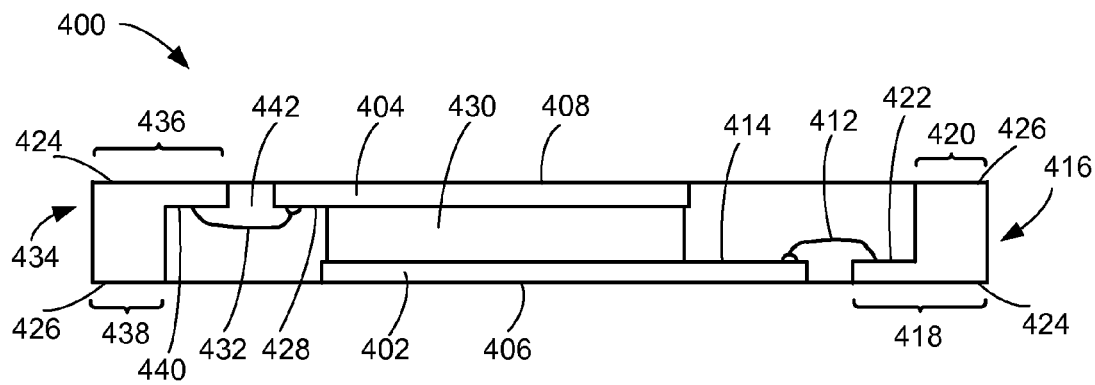
FIG. 4 is a cross-sectional view of a stackable multi-chip package system in an alternative embodiment of the present invention.

Referring now to FIG. 4, therein is shown a cross-sectional view of a stackable multi-chip package system 400 in an alternative embodiment of the present invention. This cross-sectional view may also represent the cross-sectional view of the stackable multi-chip package system 100 along the segment line 3-3 of FIG. 1. The stackable multi-chip package system 400 includes a stack of integrated circuit dice with a first integrated circuit die 402, such as a thin or ultra thin integrated circuit die, below a second integrated circuit die 404, such as a thin or ultra thin integrated circuit die. The second integrated circuit die 404 and the first integrated circuit die 402 may be substantially the same or the same type, such as functionality or technology, or may be different.

A first non-active side 406 of the first integrated circuit die 402 and a second non-active side 408 of the second integrated circuit die 404 are exposed to ambient and may be used as a thermal dissipation surface. First internal interconnects 412, such as bond wires or ribbon bond wires, connect a first active side 414 of the first integrated circuit die 402 and first external interconnects 416, such as leads.

The first external interconnects 416 have L-shape configurations with first bases 418 of the L-shape configurations extending more to the interior of the stackable multi-chip package system 400 than first tips 420 of the L-shape configuration. The first internal interconnects 412 attach to first inner portions 422 of the first bases 418. Sides of the first bases 418 opposite the first inner portions 422 are part of second lands 424 of the second row 112 of FIG. 2. The first tips 420 are part of first lands 426 of the first row 108 of FIG. 1.

A second active side 428 of the second integrated circuit die 404 is over and faces the first active side 414 with an inter-chip structure 430, such as a die-attach adhesive, a spacer, or an electromagnetic interference (EMI shield, in between. The second integrated circuit die 404 is offset from the first integrated circuit die 402 such that the second integrated circuit die 404 and the inter-chip structure 430 do not perturb the connections of the first internal interconnects 412 and the first integrated circuit die 402. Second internal interconnects 432, such as bond wires or ribbon bond wires, connect the second active side 428 and second external interconnects 434.

The second external interconnects 434 are shown in similar L-shape configurations as the first external interconnects 416 but rotated 180 degrees or referred to as inverted from the first external interconnects 416. Second bases 436 of the second external interconnects 434 overhang second tips 438 of the second external interconnects 434. The second internal interconnects 432 attach to second inner portions 440 of the second bases 436. Sides of the second bases 436 opposite the second inner portions 440 are part of the second lands 424 of the second row 112 of FIG. 1. The second tips 438 are part of the first lands 426 of the first row 108 of FIG. 2.

An encapsulation 442, such as an epoxy mold compound, covers the second internal interconnects 432 and the first internal interconnects 412. The encapsulation 442 partially covers the first integrated circuit die 402, with the first non-active side 406 exposed, and the second integrated circuit die 404, with the second non-active side 408 exposed. The first integrated circuit die 402, the second integrated circuit die 404, the encapsulation 442, and the inter-chip structure 430 functions collaboratively as a structure for planar rigidity.

The encapsulation 442 also partially covers the first external interconnects 416 exposing the first lands 426 and the second lands 424 of the first external interconnects 416. Similarly, the encapsulation 442 partially covers the second external interconnects 434 exposing the first lands 426, the second lands 424 of the second external interconnects 434.

The staggered configuration of the first row 108 of FIG. 1 and the second row 112 of FIG. 1 are the first external interconnects 416 and the second external interconnects 434 at alternating locations forming mold interlock features. The interlock features improves performance in moisture level sensitivity (MSL) tests as well as increase structural rigidity.

The stackable multi-chip package system 400 may tested to verify known good devices (KGD) of the second integrated circuit die 404 and the first integrated circuit die 402. The stackable multi-chip package system 400 may be a thin package, especially with thin or ultra-thin dice, having a package height of 0.20 mm.

Figure 5:
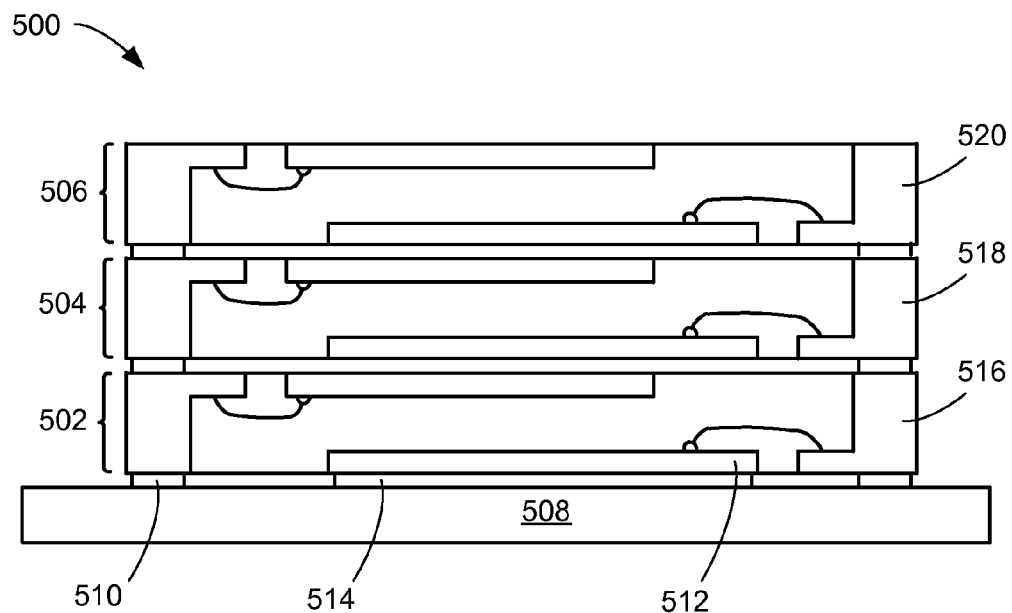
FIG. 5 is a cross-sectional view of an integrated circuit package-on-package system with the stackable multi-chip package system in another alternative embodiment of the present invention.

Referring now to FIG. 5, therein is shown a cross-sectional view of an integrated circuit package-on-package system 500 with the stackable multi-chip package system 300 in another alternative embodiment of the present invention. The integrated circuit package-on-package system 500 has a first package 502 stacked below a second package 504 with the second package 504 below a third package 506. The first package 502, the second package 504, and the third package 506 may be of similar or substantially the same as the stackable multi-chip package system 300 of FIG. 3.

The first package 502 is attached on a substrate 508, such as a printed circuit board, with a conductive material 510, such as a solder paste. A exposed portion of an integrated circuit die 512 of the first package 502 is attached to the substrate 508 with an adhesive 514, such as a thermal adhesive or film adhesive. The substrate 508 may serve various functions, such as a system level heat sink for the integrated circuit die 512. First package external interconnects 516 are connected to the substrate 508 with the conductive material 510.

The second package 504 stacks on the first package 502 with second package external interconnects 518 connected to tops of the first package external interconnects 516 with the conductive material 510. Similarly, the third package 506 stacks on the second package 504 with third package external interconnects 520 connected to tops of the second package external interconnects 518 with the conductive material 510.

The first package 502, the second package 504, and the third package 506 may be tested to ensure KGD before the package-on-package assembly process. This ensures any bad device is sorted out such that the yield for the integrated circuit package-on-package system 500 is not impacted by bad device. The integrated circuit package-on-package system 500 may further undergo testing during and after assembly.

Figure 6:
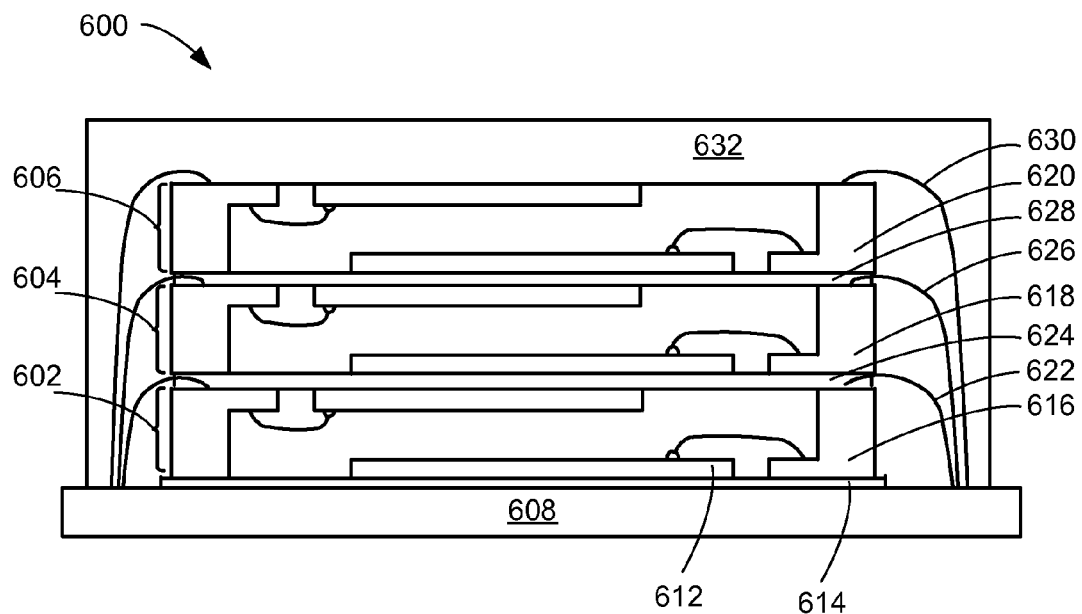
FIG. 6 is a cross-sectional view of an integrated circuit package-in-package system with the stackable multi-chip package system in yet another alternative embodiment of the present invention.

Referring now to FIG. 6, therein is shown a cross-sectional view of an integrated circuit package-in-package system 600 with the stackable multi-chip package system 300 in yet another alternative embodiment of the present invention. The integrated circuit package-in-package system 600 as a first package 602 stacked below a second package 604 with the second package 604 below a third package 606. The first package 602, the second package 604, and the third package 606 may be of similar or substantially the same as the stackable multi-chip package system 300 of FIG. 3.

The first package 602 is attached on a substrate 608, such as a printed circuit board, with an adhesive 614, such as a thermal adhesive. First package external interconnects 616 of the first package 602 are connected to the substrate 608 with first interconnects 622, such as bond wires.

The second package 604 stacks over the first package 602 with a first intra-stack structure 624, such as a film adhesive, in between. Second package external interconnects 618 of the second package 604 are connected to the substrate 608 with second interconnects 626, such as bond wires.

Similarly, the third package 606 stacks over the second package 604 with a second intra-stack structure 628, such as a film adhesive, in between. Third package external interconnects 620 of the third package 606 are connected to the substrate 608 with third interconnects 630, such as bond wires.

A package encapsulation 632 covers the first package 602, the second package 604, the third package 606, the first interconnects 622, the second interconnects 626, and the third interconnects 630. The package encapsulation 632 may be any number of materials, such as an epoxy molding compound.

The first package 602, the second package 604, and the third package 606 may be tested to ensure KGD before the package-in-package assembly process. This ensures any bad device is sorted out such that the yield for the integrated circuit package-in-package system 600 is not impacted by bad devices. The integrated circuit package-in-package system 600 may further undergo testing during and after assembly.

Figure 7:
FIG. 7 is a cross-sectional view of the stackable multi-chip package system of FIG. 3 in a first tape-attach phase.

Referring now to FIG. 7, therein is shown a cross-sectional view of the stackable multi-chip package system 300 of FIG. 3 in a first tape-attach phase. This cross-sectional view depicts the first bases 318 on a first coverlay tape 702. The first external interconnects 316 are part of lead frame (not shown). The first bases 318 and the first tips 320 may be formed by a number of processes, such as deep etching of the lead frame, resulting in the L-shape configuration.

Figure 8:
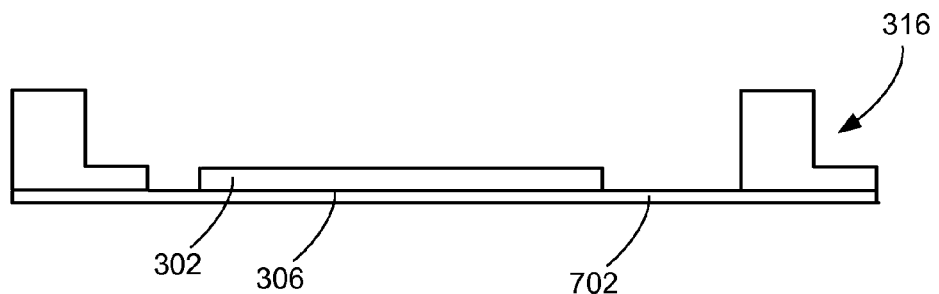
FIG. 8 is a cross-sectional view of the structure of FIG. 7 in a first die-attach phase.

Referring now to FIG. 8, therein is shown a cross-sectional view of the structure of FIG. 7 in a first die-attach phase. The first non-active side 306 of the first integrated circuit die 302 is attached on the first coverlay tape 702 between instances of the first external interconnects 316 but closer to one than another.

Figure 9:
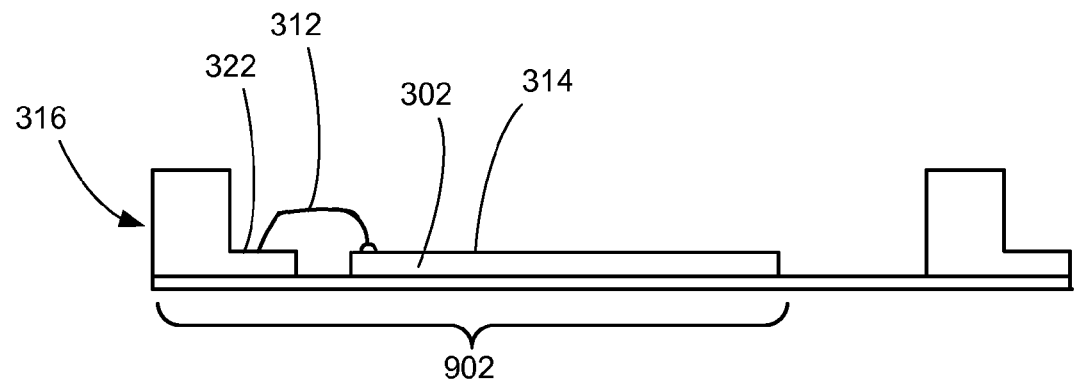
FIG. 9 is a cross-sectional view of the structure of FIG. 8 in a first interconnect-attach phase.

Referring now to FIG. 9, therein is shown a cross-sectional view of the structure of FIG. 8 in a first interconnect-attach phase. The first internal interconnects 312 connect the first active side 314 of the first integrated circuit die 302 and the first inner portions 322 of the first external interconnects 316. This forms first package subassemblies 902 in the lead frame (not shown), wherein each of the first package subassemblies 902 has the first integrated circuit die 302 attached to the first external interconnects 316 with the first internal interconnects 312.

Figure 10:
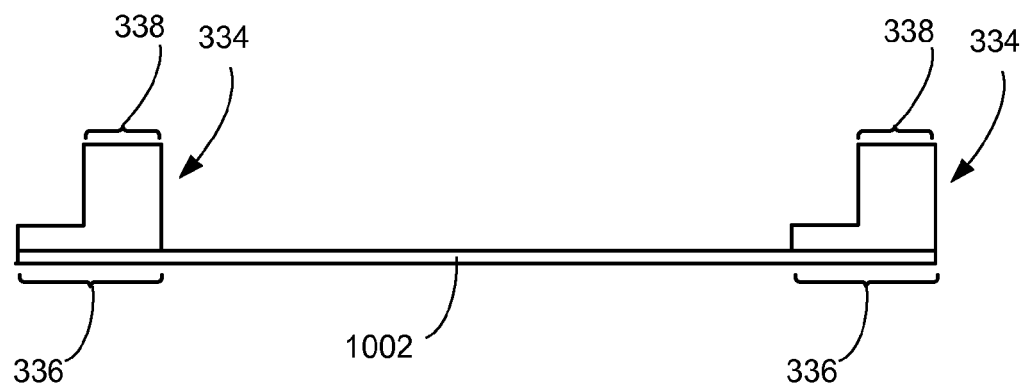
FIG. 10 is a cross-sectional view of the stackable multi-chip package system of FIG. 3 in a second tape-attach phase.

Referring now to FIG. 10, therein is shown a cross-sectional view of the stackable multi-chip package system 300 of FIG. 3 in a second tape-attach phase. This cross-sectional view depicts the second bases 336 on a second coverlay tape 1002. The second external interconnects 334 are part of lead frame (not shown) and shown in horizontally flipped L-shape. The second bases 336 and the second tips 338 may be formed by a number of processes, such as deep etching of the lead frame, resulting in the L-shape configuration.

Figure 11:
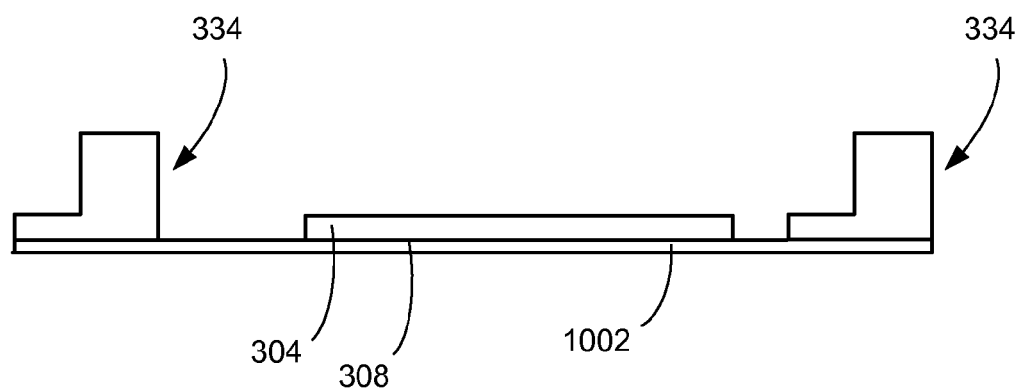
FIG. 11 is a cross-sectional view of the structure of FIG. 10 in a second die-attach phase.

Referring now to FIG. 11, therein is shown a cross-sectional view of the structure of FIG. 10 in a second die-attach phase. The second non-active side 308 of the second integrated circuit die 304 is attached on the second coverlay tape 1002 between instances of the second external interconnects 334 but closer to one than another.

Figure 12:
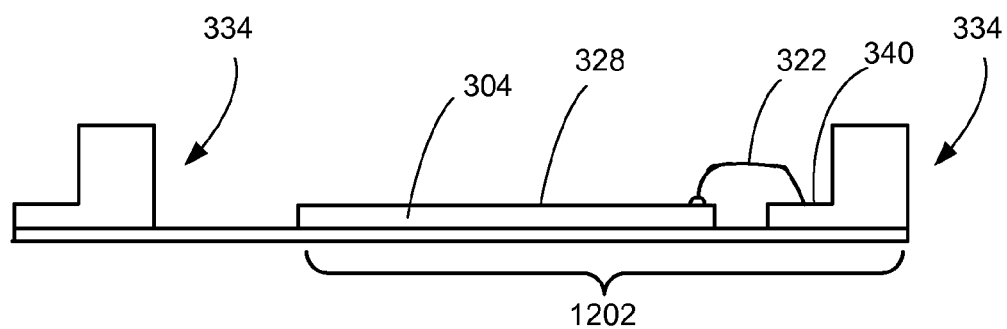
FIG. 12 is a cross-sectional view of the structure of FIG. 11 in a second interconnect-attach phase.

Referring now to FIG. 12, therein is shown a cross-sectional view of the structure of FIG. 11 in a second interconnect-attach phase. The second internal interconnects 332 connect the second active side 328 of the second integrated circuit die 304 and the second inner portions 340 of the second external interconnects 334. This forms second package subassemblies 1202 in the lead frame (not shown), wherein each of the second package subassemblies 1202 has the second integrated circuit die 304 attached to the second external interconnects 334 with the second internal interconnects 332.

Figure 13:
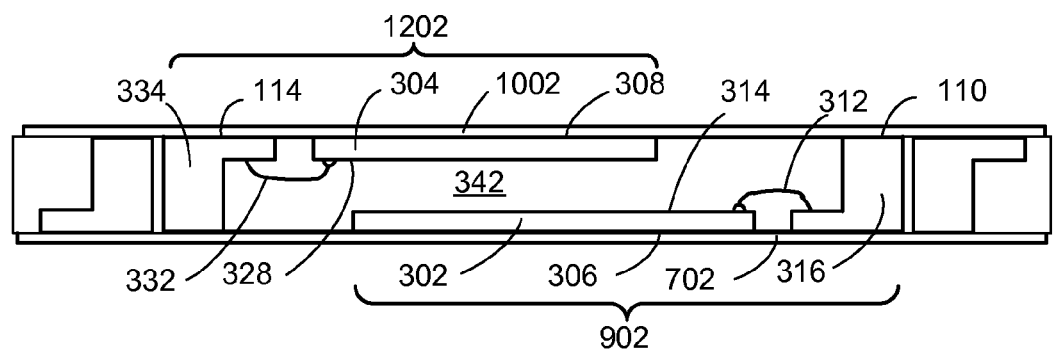
FIG. 13 is a cross-sectional view of the structure of FIG. 12 over the structure of FIG. 9 in a molding phase.

Referring now to FIG. 13, therein is shown a cross-sectional view of the structure of FIG. 12 over the structure of FIG. 9 in a molding phase. The second package subassemblies 1202 in the lead frame (not shown) attached to the first coverlay tape 702 are vertically flipped and placed over the first package subassemblies 902 also in its lead frame (not shown) attached to the second coverlay tape 1002. This combined structure has the second integrated circuit die 304 over and offset the first integrated circuit die 302 with the first active side 314 facing the second active side 328. The first external interconnects 316 and the second external interconnects 334 connected to the first integrated circuit die 302 and the second integrated circuit die 304, respectively, forming the boundaries of the stackable multi-chip package system 300 of FIG. 3 in the lead frame.

The combined structure undergoes a molding process forming the encapsulation 342. The encapsulation 342 covers the first integrated circuit die 302, the first internal interconnects 312, and the second internal interconnects 332. The first coverlay tape 702 and the second coverlay tape 1002 bound the molding process such that the encapsulation 342 does not cover the first non-active side 306, the second non-active side 308, the first lands 110, and the second lands 114.

Figure 14:
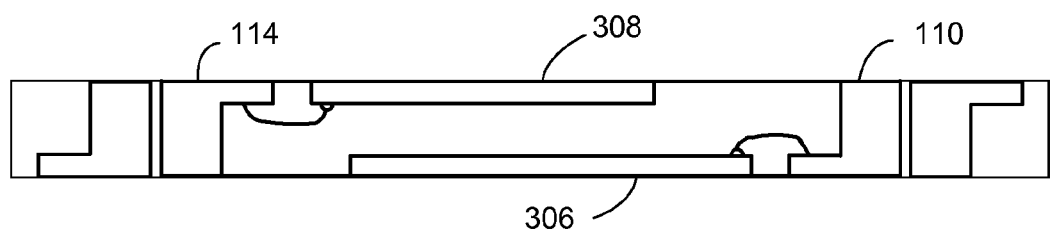
FIG. 14 is a cross-sectional view of the structure of FIG. 13 in a de-taping phase.

Referring now to FIG. 14, therein is shown a cross-sectional view of the structure of FIG. 13 in a de-taping phase. The structure of FIG. 13 undergoes a de-taping and post mold cure. The first coverlay tape 702 of FIG. 7 and the second coverlay tape 1002 of FIG. 10 are removed exposing the first non-active side 306, the second non-active side 308, the first lands 110, and the second lands 114.

Figure 15:
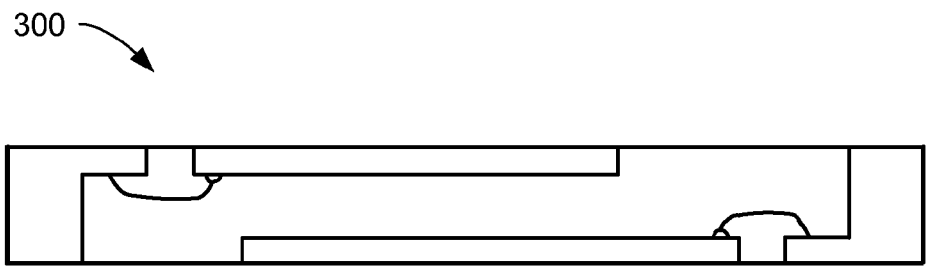
FIG. 15 is a cross-sectional view of the structure of FIG. 14 in a singulation phase.

Referring now to FIG. 15, therein is shown a cross-sectional view of the structure of FIG. 14 in a singulation phase. The structure of FIG. 14 may undergo an optional plating process, such as plating gold, for improved conductivity and bonding. The structure of FIG. 14 is singulated from the lead frame (not shown) forming the stackable multi-chip package system 300.

Figure 16:
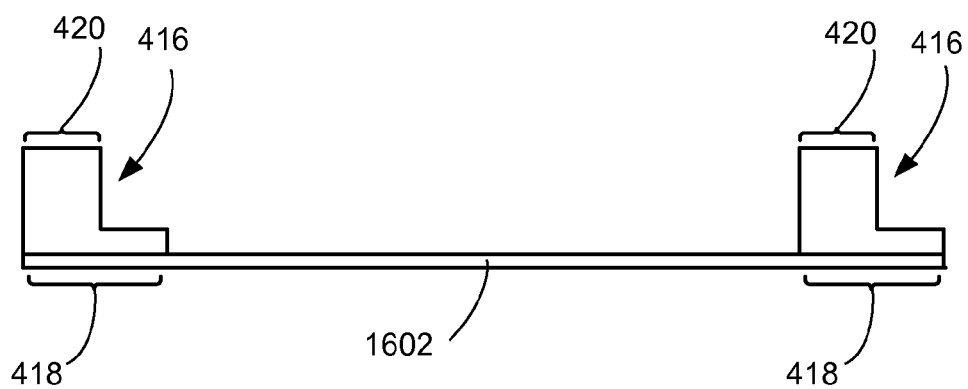
FIG. 16 is a cross-sectional view of the stackable multi-chip package system of FIG. 4 in a first tape-attach phase.

Referring now to FIG. 16, therein is shown a cross-sectional view of the stackable multi-chip package system 400 of FIG. 4 in a first tape-attach phase. This cross-sectional view depicts the first bases 418 on a first coverlay tape 1602. The first external interconnects 416 are part of lead frame (not shown). The first bases 418 and the first tips 420 may be formed by a number of processes, such as deep etching of the lead frame, resulting in the L-shape configuration.

Figure 17:
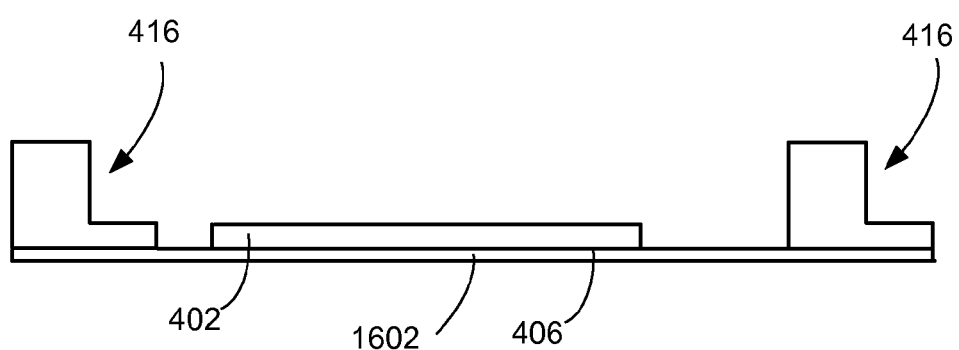
FIG. 17 is a cross-sectional view of the structure of FIG. 16 in a first die-attach phase.

Referring now to FIG. 17, therein is shown a cross-sectional view of the structure of FIG. 16 in a first die-attach phase. The first non-active side 406 of the first integrated circuit die 402 is attached on the first coverlay tape 1602 between instances of the first external interconnects 416 but closer to one than another.

Figure 18:
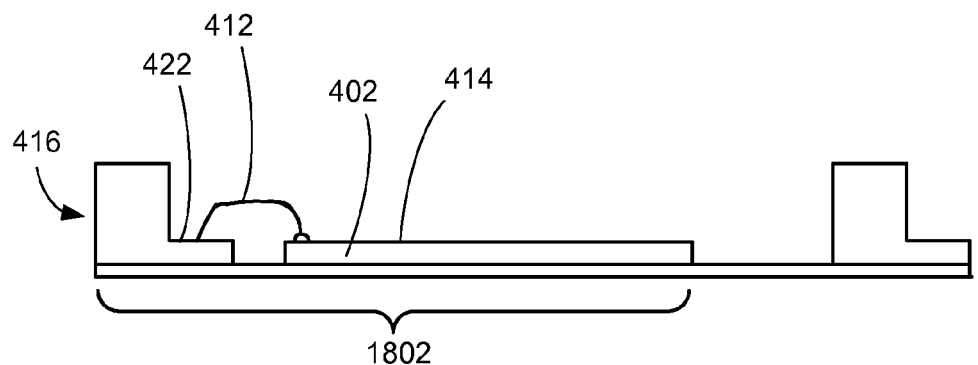
FIG. 18 is a cross-sectional view of the structure of FIG. 17 in a first interconnect-attach phase.

Referring now to FIG. 18, therein is shown a cross-sectional view of the structure of FIG. 17 in a first interconnect-attach phase. The first internal interconnects 412 connect the first active side 414 of the first integrated circuit die 402 and the first inner portions 422 of the first external interconnects 416. This forms first package subassemblies 1802 in the lead frame (not shown), wherein each of the first package subassemblies 1802 has the first integrated circuit die 402 attached to the first external interconnects 416 with the first internal interconnects 412.

Figure 19:
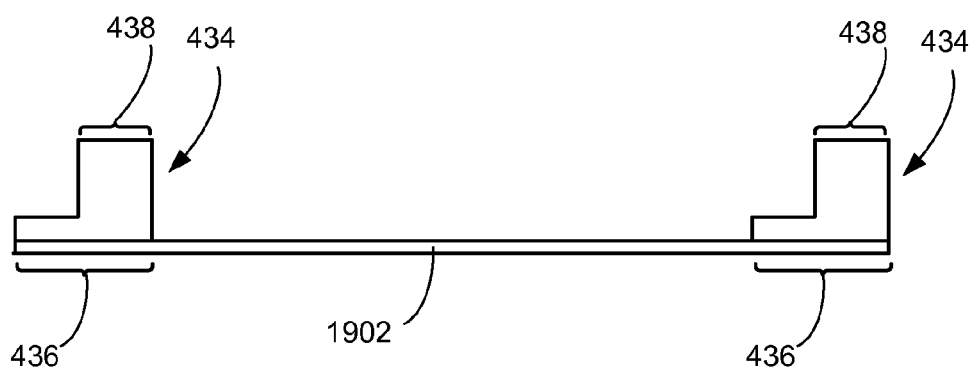
FIG. 19 is a cross-sectional view of the stackable multi-chip package system of FIG. 4 in a second tape-attach phase.

Referring now to FIG. 19, therein is shown a cross-sectional view of the stackable multi-chip package system 400 of FIG. 4 in a second tape-attach phase. This cross-sectional view depicts the second bases 436 on a second coverlay tape 1902. The second external interconnects 434 are part of lead frame (not shown) and shown in horizontally flipped L-shape. The second bases 436 and the second tips 438 may be formed by a number of processes, such as deep etching of the lead frame, resulting in the L-shape configuration.

Figure 20:
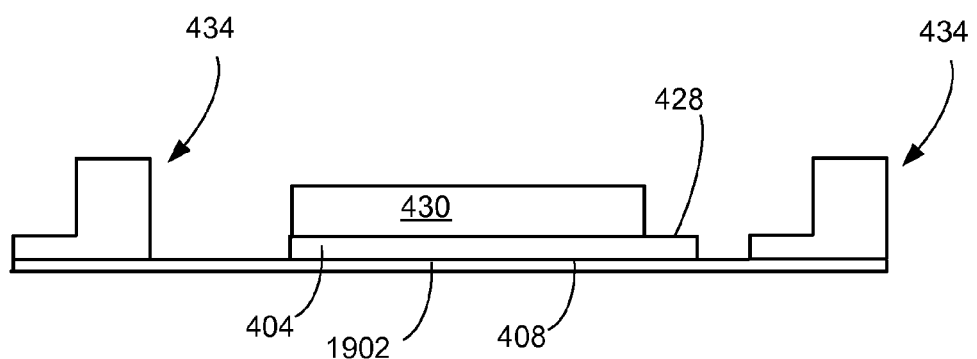
FIG. 20 is a cross-sectional view of the structure of FIG. 19 in a second die-attach phase.

Referring now to FIG. 20, therein is shown a cross-sectional view of the structure of FIG. 19 in a second die-attach phase. The second non-active side 408 of the second integrated circuit die 404 is attached on the second coverlay tape 1902 between instances of the second external interconnects 434 but closer to one than another. The inter-chip structure 430 is placed on the second active side 428 without impeding electrical connections.

Figure 21:
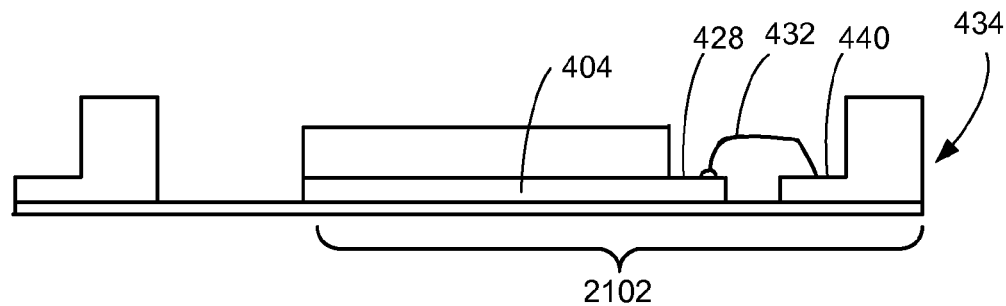
FIG. 21 is a cross-sectional view of the structure of FIG. 20 in a second interconnect-attach phase.

Referring now to FIG. 21, therein is shown a cross-sectional view of the structure of FIG. 20 in a second interconnect-attach phase. The second internal interconnects 432 connect the second active side 428 of the second integrated circuit die 404 and the second inner portions 440 of the second external interconnects 434. This forms second package subassemblies 2102 in the lead frame (not shown), wherein each of the second package subassemblies 2102 has the second integrated circuit die 404 attached to the second external interconnects 434 with the second internal interconnects 432.

Figure 22:
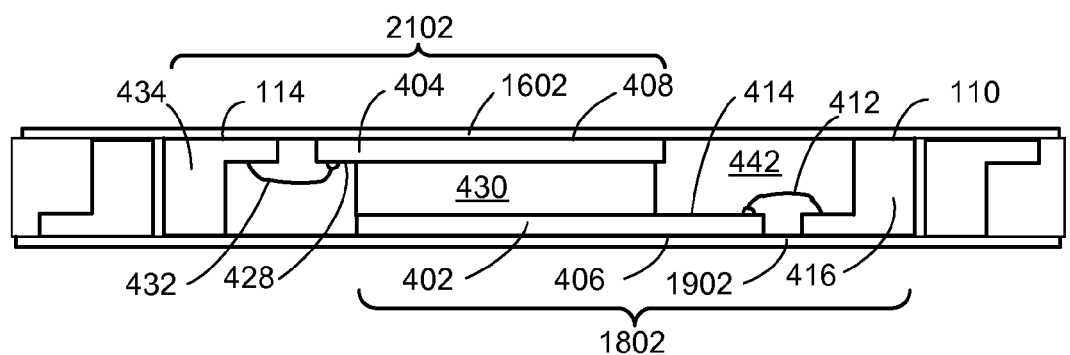
FIG. 22 is a cross-sectional view of the structure of FIG. 21 over the structure of FIG. 18 in a molding phase.

Referring now to FIG. 22, therein is shown a cross-sectional view of the structure of FIG. 21 over the structure of FIG. 18 in a molding phase. The second package subassemblies 2102 in the lead frame (not shown) attached to the first coverlay tape 1602 are vertically flipped and placed over the first package subassemblies 1802 also in its lead frame (not shown) attached to the second coverlay tape 1902. This combined structure has the second integrated circuit die 404 over and offset the first integrated circuit die 402 with the first active side 414 facing the second active side 428. The inter-chip structure 430 is between the first integrated circuit die 402 and the second integrated circuit die 404. The first external interconnects 416 and the second external interconnects 434 are connected to the first integrated circuit die 402 and the second integrated circuit die 404, respectively, forming the boundaries of the stackable multi-chip package system 400 of FIG. 4 in the lead frame.

The combined structure undergoes a molding process forming the encapsulation 442. The encapsulation 442 covers the first integrated circuit die 402, the first internal interconnects 412, and the second internal interconnects 432. The first coverlay tape 1602 and the second coverlay tape 1902 bound the molding process such that the encapsulation 442 does not cover the first non-active side 406, the second non-active side 408, the first lands 110, and the second lands 114.

Figure 23:
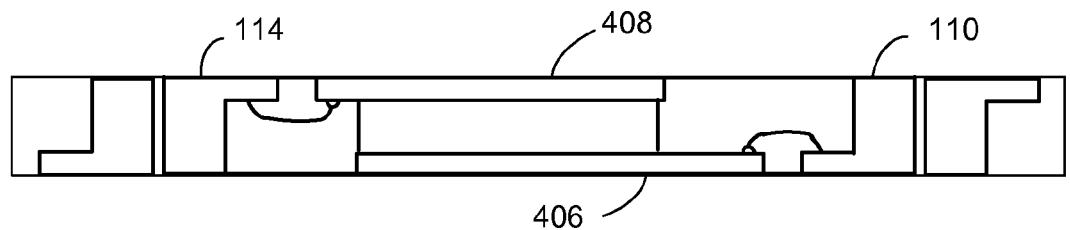
FIG. 23 is a cross-sectional view of the structure of FIG. 22 in a de-taping phase.

Referring now to FIG. 23, therein is shown a cross-sectional view of the structure of FIG. 22 in a de-taping phase. The structure of FIG. 13 undergoes a de-taping and post mold cure. The first coverlay tape 1602 of FIG. 16 and the second coverlay tape 1902 of FIG. 19 are removed exposing the first non-active side 406, the second non-active side 408, the first lands 110, and the second lands 114.

Figure 24:
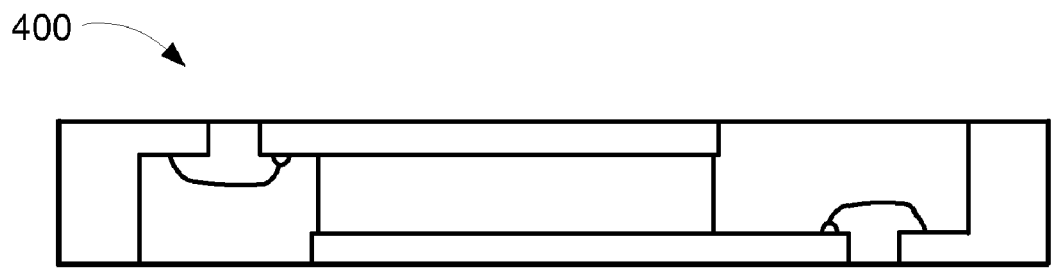
FIG. 24 is a cross-sectional view of the structure of FIG. 23 in a singulation phase.

Referring now to FIG. 24, therein is shown a cross-sectional view of the structure of FIG. 23 in a singulation phase. The structure of FIG. 23 may undergo an optional plating process, such as plating gold, for improved conductivity and bonding. The structure of FIG. 23 is singulated from the lead frame (not shown) forming the stackable multi-chip package system 400.

Figure 25:
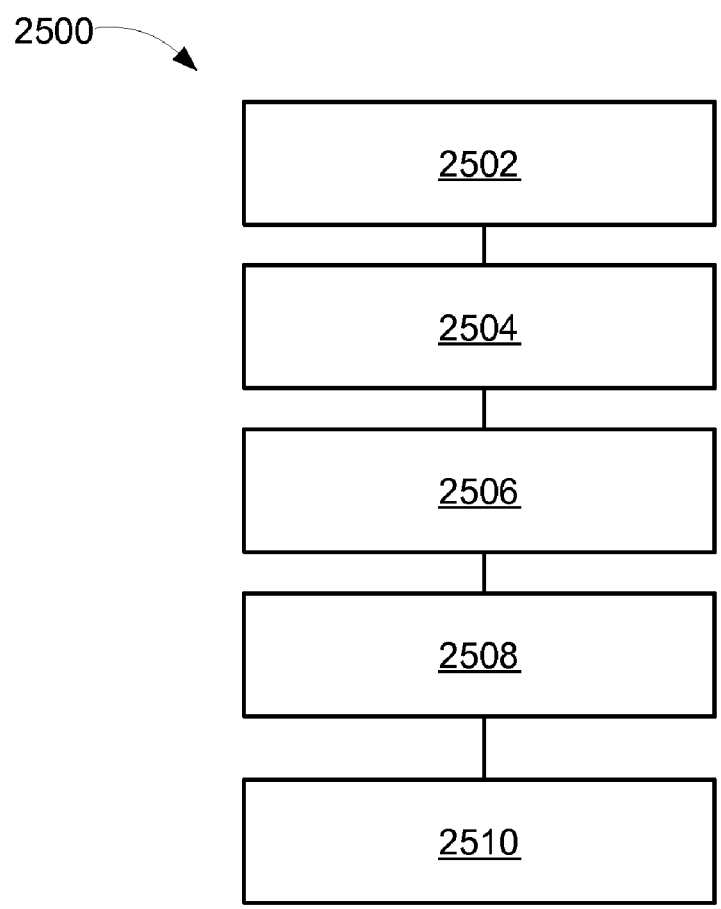
FIG. 25 is a flow chart of a stackable multi-chip package system for manufacture of the stackable multi-chip package system in an embodiment of the present invention.

Referring now to FIG. 25, therein is shown a flow chart of a stackable multi-chip package system 2500 for manufacture of the stackable multi-chip package system 300 in an embodiment of the present invention. The system 2500 includes forming an external interconnect having a base and a tip in a block 2502; connecting a first integrated circuit die and the base in a block 2504; stacking a second integrated circuit die over the first integrated circuit die in an active side to active side configuration in a block 2506; connecting the second integrated circuit die and the base in a block 2508; and molding the first integrated circuit die, the second integrated circuit die, and the external interconnect partially exposed in a block 2510.

It has been discovered that the present invention thus has numerous aspects.

It has been discovered that the present invention provides stackable multi-chip package having a very low package height with enhanced thermal performance, structural rigidity to prevent warpage, high lands count, and flexibility connection options from both the top and bottom of the package.

An aspect is that the present invention provides an offset face-to-face stacking configuration of the second integrated circuit die and the first integrated circuit die for providing a low package height. The face-to-face configuration refers to an active side to active side configuration.

Another aspect of the present invention provides an offset face-to-face stacking configuration of the second integrated circuit die and the first integrated circuit die for protection of the circuitry on the active sides of the integrated circuit dice as well as providing multiple thermal dissipation paths to ambient.

Yet another aspect of the present invention provides the encapsulation with or without an inter-chip structure to fortify the planar rigidity of the package and to mitigate warpage. The inter-chip structure may serve as an EMI shield when connected to ground.

Yet another aspect of the present invention provides mold lock feature from the staggered configuration of the first and second external interconnects in the first and second rows of lands. This provides both additional structural support as well as improves performance in MSL tests.

Yet another aspect of the present invention is that the stackable multi-chip package system has a substantially symmetrical structure along the x, y, and z axes for a well balanced package structure to overcome coefficient of thermal expansion (CTE) mismatch from the materials of the package thereby eliminating a source of package warpage.

Yet another aspect of the present invention provides the flexibility of stacking in different configurations, such as package-on-package or package-in-package configurations Yet another aspect of the present invention provides electrical connectivity on both the top and bottom of the package to accommodate different system connection requirements and stacking configurations.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the stackable multi-chip package system method of the present invention furnishes important and heretofore unknown and unavailable solutions, capabilities, and functional aspects for improving thermal performance, reducing EMI, and reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a stackable multi-chip package system comprising:
   forming external interconnects each having a base and a tip;
   connecting a first integrated circuit die and the base;
   stacking a second integrated circuit die over the first integrated circuit die in an active side to active side configuration including positioning a second external interconnect having a second base coplanar with the tip;
   connecting the second integrated circuit die and the second base; and
   molding an encapsulation on the first integrated circuit die, the second integrated circuit die, and the external interconnects partially exposed including each having the base and the tip coplanar with the encapsulation.

2. The method as claimed in claim 1 wherein stacking the second integrated circuit die over the first integrated circuit die includes placing an inter-chip structure in between.

3. The method as claimed in claim 1 further comprising stacking a first stackable multi-chip package system over a second stackable multi-chip package system.

4. The method as claimed in claim 1 further comprising:
   mounting a first stackable multi-chip package system over a substrate;
   stacking a second stackable multi-chip package system over the first stackable multi-chip package system; and
   molding the first stackable multi-chip package system and the second stackable multi-chip package system with the substrate.

5. The method as claimed in claim 1 wherein:
   connecting the first integrated circuit die and the base includes:

connecting the first integrated circuit die and an inner portion of the base; and
connecting the second integrated circuit die and the second base further includes:
  connecting the second integrated circuit die and an inner portion of the second base.

6. A stackable multi-chip package system comprising:
external interconnects each having a base and a tip;
an interconnect between a first integrated circuit die and the base;
a second integrated circuit die over the first integrated circuit die in an active side to active side configuration includes a second external interconnect with a second base positioned coplanar with the tip;
a second internal interconnect between the second integrated circuit die and the second base; and
an encapsulation to partially cover the first integrated circuit die, the second integrated circuit die, and the external interconnects each includes the base and the tip coplanar with the encapsulation.

7. The system as claimed in claim 6 wherein the second integrated circuit die over the first integrated circuit die has an inter-chip structure in between.

8. The system as claimed in claim 6 further comprising a first stackable multi-chip package system over a second stackable multi-chip package system.

9. The system as claimed in claim 6 further comprising:
a first stackable multi-chip package system over a substrate;
a second stackable multi-chip package system over the first stackable multi-chip package system; and
a package encapsulation to cover the first stackable multi-chip package system and the second stackable multi-chip package system with the substrate.

10. The system as claimed in claim 6 wherein:
the interconnect between the first integrated circuit die and the base includes:
  the interconnect between the first integrated circuit die and an inner portion of the base; and
the second internal interconnect between the second integrated circuit die and the base further includes:
  the second internal interconnect between the second integrated circuit die and an inner portion of the base.

11. The system as claimed in claim 6 wherein:
the external interconnect is a L-shape external interconnect having the base and the tip;
the interconnect between the first integrated circuit die and the base is to an inner portion of the base;
the second integrated circuit die is offset over the first integrated circuit die in the active side to active side configuration;
the interconnect between the second integrated circuit die and the second base is to the inner portion of the second base; and
the encapsulation to partially cover the first integrated circuit die, the second integrated circuit die, and the external interconnect exposes a portion of the L-shape external interconnect, a first non-active side, and a second non-active side; and
further comprising:
  a first active side of the first integrated circuit die; and
  a second active side of the second integrated circuit die.

12. The system as claimed in claim 11 wherein the encapsulation includes:
a first land exposed; and
a second land exposed.

13. The system as claimed in claim 11 wherein the second integrated circuit die over the first integrated circuit die, in the offset and active side to active side configuration, has the second active side facing the first active side.

14. The system as claimed in claim 11 further comprising dual rows of lands with bases and tips exposed in alternating positions.

15. The system as claimed in claim 11 wherein the second integrated circuit die over the first integrated circuit die has the encapsulation in between for planar rigidity.

* * * * *

UNITED STATES PATENT AND TRADEMARK OFFICE
CERTIFICATE OF CORRECTION

PATENT NO. : 8,067,272 B2
APPLICATION NO. : 12/578797
DATED : November 29, 2011
INVENTOR(S) : Kim et al.

It is certified that error appears in the above-identified patent and that said Letters Patent is hereby corrected as shown below:

Title page, item (75) Inventors:
delete "Ii Kwon Shim, Singapore (SG)" and insert therefor --Il Kwon Shim, Singapore (SG)--

Signed and Sealed this
Eighth Day of May, 2012

David J. Kappos
*Director of the United States Patent and Trademark Office*